(12) United States Patent
Tai et al.

(10) Patent No.: US 11,581,228 B2
(45) Date of Patent: Feb. 14, 2023

(54) DISPLAY PANEL

(71) Applicant: Innolux Corporation, Miao-Li County (TW)

(72) Inventors: Ming-Jou Tai, Miao-Li County (TW); Chia-Hao Tsai, Miao-Li County (TW); Yi-Shiuan Cherng, Miao-Li County (TW); Youcheng Lu, Miao-Li County (TW)

(73) Assignee: Innolux Corporation, Miaoli County (TW)

( * ) Notice: Subject to any disclaimer, the term of this patent is extended or adjusted under 35 U.S.C. 154(b) by 0 days.

(21) Appl. No.: 17/315,371

(22) Filed: May 10, 2021

(65) Prior Publication Data

US 2021/0384089 A1    Dec. 9, 2021

(30) Foreign Application Priority Data

Jun. 4, 2020 (CN) .......................... 202010499270.7

(51) Int. Cl.
*H01L 23/58* (2006.01)
*H01L 21/66* (2006.01)
*H01L 27/12* (2006.01)

(52) U.S. Cl.
CPC .......... *H01L 22/34* (2013.01); *H01L 27/1244* (2013.01)

(58) Field of Classification Search
CPC ................................. H01L 22/34; G09G 3/006
USPC .................. 438/11, 17–18, 110; 257/48, 206
See application file for complete search history.

(56) References Cited

U.S. PATENT DOCUMENTS

| | | | | |
|---|---|---|---|---|
| 8,937,584 B2* | 1/2015 | Kwak | ................ | G09G 3/3208 345/82 |
| 10,852,606 B2* | 12/2020 | Nie | ..................... | G02F 1/13458 |
| 2018/0336809 A1* | 11/2018 | Xi | ............................ | G09G 3/20 |

* cited by examiner

*Primary Examiner* — Calvin Lee
(74) *Attorney, Agent, or Firm* — JCIPRNET

(57) ABSTRACT

A display panel is provided. The display panel includes a plurality of signal lines and a testing circuit. The testing circuit includes a plurality of transistors electrically connected to the plurality of signal lines. The plurality of transistors are disposed in at least two groups, and a number of transistors of each group of the at least two groups is less than a total number of the plurality of signal lines. Therefore, the testing circuit of the display panel of the disclosure can reduce the circuit placement space in the horizontal direction.

19 Claims, 7 Drawing Sheets

DISPLAY PANEL

CROSS-REFERENCE TO RELATED APPLICATION

This application claims the priority benefit of China application serial no. 202010499270.7, filed on Jun. 4, 2020. The entirety of the above-mentioned patent application is hereby incorporated by reference herein and made a part of this specification.

BACKGROUND

Technical Field

The disclosure relates to a panel, and more particularly to a display panel provided with a testing circuit.

Description of Related Art

For a small-sized display device, since the size and pixel pitch of the display panel are relatively small, the lower peripheral region of the display panel lacks a sufficient circuit placement space in the horizontal direction to dispose a light on test (LOT) circuit. That is to say, a small-sized display device has to dispose the LOT circuit by increasing the size of the display panel, so the small-sized display device fails to achieve the effect of a narrow bezel. In view of this, the following proposes several solutions in the embodiments.

SUMMARY

The disclosure proposes a display panel provided with a testing circuit, which can effectively reduce the circuit placement space of the testing circuit in the horizontal direction.

According to an embodiment of the disclosure, the display panel of the disclosure includes a plurality of signal lines and a testing circuit. The testing circuit includes a plurality of transistors electrically connected to the plurality of signal lines. The plurality of transistors are disposed in at least two groups, and a number of transistors of each group of the at least two groups is less than a total number of the plurality of signal lines.

Based on the above, the display panel of the disclosure may divide the plurality of transistors of the testing circuit into at least two groups to be disposed in at least two rows in the vertical direction, so as to effectively save the circuit placement space of the testing circuit in the horizontal direction of the peripheral region of the display panel.

To make the aforementioned features and advantages of the disclosure more comprehensible, embodiments accompanied with drawings are described in detail below.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1:
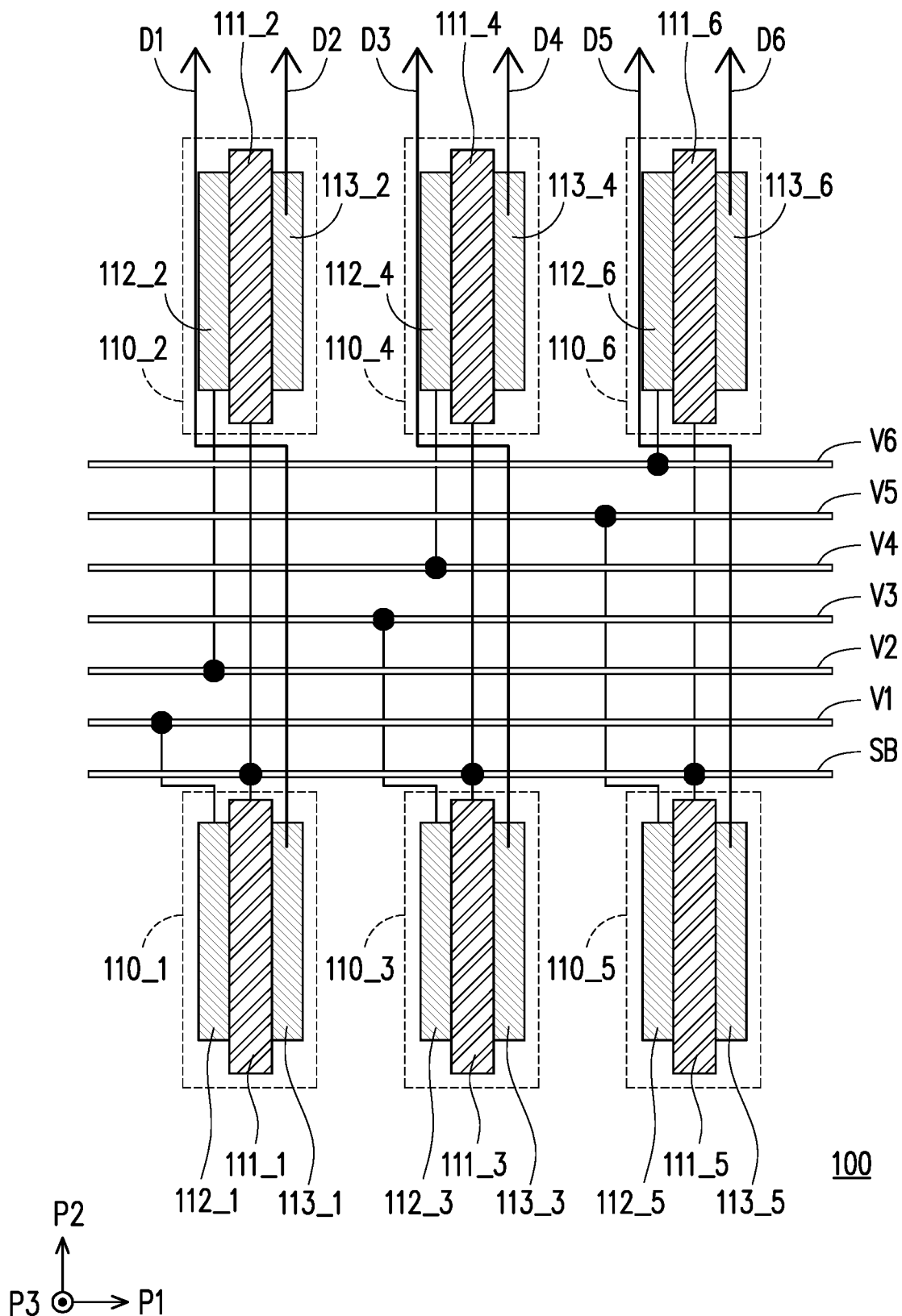
FIG. 1 is a schematic view of a testing circuit according to the first embodiment of the disclosure.

Throughout the specification and appended claims of the disclosure, certain words are used to refer to specific elements. Persons skilled in the art should understand that electronic device manufacturers may refer to the same elements by different names. The text does not intend to distinguish the elements with the same function but different names. In the following specification and claims, the words "comprise" and "include" are open-ended words and thus should be interpreted as the meaning of "comprising but not limited to . . . "

Directional terms mentioned in the text, such as "upper," "lower," "front," "back," "left," "right," etc., merely refer to directions with reference to the accompanying drawings. Therefore, the directional terms used are used to illustrate, but not to limit the disclosure. In the drawings, each drawing shows the general features of the methods, structures, and/or materials used in specific embodiments. However, the drawings should not be interpreted as defining or limiting the scope or nature covered by the embodiments. For example, for the sake of clarity, the relative size, thickness, and position of each film layer, region, and/or structure may be shrunk or enlarged.

In some embodiments of the disclosure, terms related to engagement and connection, such as "connect", "interconnect", etc., unless specifically defined, may mean that two structures are in direct contact, or that two structures are not in direct contact and another structure is provided between the two structures. The terms related to engagement and connection may also include the case where two structures are movable or two structures are fixed. In addition, the term "electrical connection" includes any direct and indirect electrical connection means.

The ordinal numbers used in the specification and claims, such as "first", "second", and the like, are used to modify elements, but neither imply nor represent that the/the plurality of element(s) has/have any previous ordinal numbers, and represent neither the order of an element and another element nor the order of the manufacturing method. The ordinal numbers are merely used to clearly distinguish an element with a certain name from another element with the same name. It is possible that the same term is not used in the claims and the specification, accordingly, the first element in the specification may be the second element in the claims. It should be understood that the following embodiments may replace, reorganize, and mix the technical features of several different embodiments to complete other embodiments without departing from the spirit of the disclosure.

In each embodiment of the disclosure, a display panel may, for example, include a liquid crystal, a light emitting diode, a quantum dot (QD), fluorescence, phosphor, other suitable materials, or a combination of the foregoing, but is not limited thereto. The light emitting diode may, for example, include an organic light emitting diode (OLED), a mini LED, a micro LED, a quantum dot LED (QLED or QDLED), fluorescence, phosphor, or other suitable materials, and the materials may be arbitrarily arranged and combined, but is not limited thereto. In each embodiment of the disclosure, the display panel may be, for example, disposed in a virtual reality (VR) device or other small-sized display devices.

FIG. 1 is a schematic view of a testing circuit according to the first embodiment of the disclosure. Referring to FIG. 1, a circuit 100 includes a testing circuit and a plurality of signal lines D1 to D6. The circuit 100 is a partial circuit of a peripheral region (surrounding area) on a substrate of the display panel. In the present embodiment, the testing circuit includes a plurality of transistors 110_1 to 110_6 electrically connected to the signal lines D1 to D6, and includes a plurality of testing signal lines V1 to V6 and a control line SB. In the present embodiment, the transistors 110_1 to 110_6 are disposed in two groups, which may be divided into an odd group (the transistors 110_1, 110_3, and 110_5) and an even group (the transistors 110_2, 110_4, and 110_6). The two groups of transistors are respectively arranged in a first direction P1 (horizontal direction), and the two groups of transistors are disposed in two rows in a second direction P2 (vertical direction). The first direction P1, the second direction P2, and a third direction P3 are perpendicular to each other. The two groups of transistors are separately disposed on both sides of a wire region of the testing signal lines V1 to V6 and the control line SB.

It is worth noting that the number of transistors and the number of signal lines of the testing circuit of the disclosure are merely examples, and are not limited to FIG. 1. The number of transistors and the number of signal lines of the testing circuit of a real product are far greater than the numbers as shown in FIG. 1, and may be determined according to a panel specification, a panel resolution, or a special testing requirement. In the present embodiment, the plurality of transistors of the disclosure are disposed in at least two groups, and the number of transistors of each group of the at least two groups is less than a total number of the signal lines. In addition, extending toward the second direction P2 from the signal lines D1 to D6, a display panel 10 may further include a pixel array. The signal lines D1 to D6 may be, for example, coupled to a plurality of data lines from the first column to the sixth column of the pixel array, and the testing circuit may, for example, further include another plurality of transistors along the first direction P1. The configuration of the another plurality of transistors may be the same as the configuration of the transistors 110_1 to 110_6, and the another plurality of transistors are, for example, electrically connected to the data lines from the seventh column to the twelfth column of the pixel array.

In the present embodiment, the transistors 110_1 to 110_6 respectively include gates 111_1 to 111_6, drains 112_1 to 112_6, and sources 113_1 to 113_6. The gates 111_1 to 111_6 of the transistors 110_1 to 110_6 are electrically connected to the control line SB to receive a control signal. The drains 112_1 to 112_6 of the transistors 110_1 to 110_6 are respectively electrically connected to the testing signal lines V1 to V6 to respectively receive testing signals. The sources 113_1 to 113_6 of the transistors 110_1 to 110_6 are respectively electrically connected to the signal lines D1 to D6 to respectively provide driving signals to corresponding columns of pixel units in the corresponding pixel array through the signal lines D1 to D6, so as to, for example, perform a light on test (LOT).

More specifically, in the present embodiment, the control line SB and the testing signal lines V1 to V6 are sequentially arranged along the second direction P2. The transistors 110_1, 110_3, and 110_5 in the odd group are configured on a side adjacent to the control line SB. The transistors 110_2, 110_4, and 110_6 in the even group are configured on a side adjacent to the testing signal line V6, and are closer to the pixel array than the transistors 110_1, 110_3, and 110_5 in the odd group. The drains 112_1, 112_3, and 112_5 of the transistors 110_1, 110_3, and 110_5 in the odd group are sequentially electrically connected to the odd-numbered testing signal lines V1, V3, and V5, and the sources 113_1, 113_3, and 113_5 are sequentially electrically connected to the odd-numbered signal lines D1, D3, and D5. The drains 112_2, 112_4, and 112_6 of the transistors 110_2, 110_4, and 110_6 in the even group are sequentially electrically connected to the even-numbered testing signal lines V2, V4, and V6, and the sources 113_2, 113_4, and 113_6 are sequentially electrically connected to the even-numbered signal lines D2, D4, and D6. Therefore, since the testing circuit of the present embodiment divides the transistors 110_1 to 110_6 into the odd group (the transistors 110_1, 110_3, and 110_5) and the even group (the transistors 110_2, 110_4, and 110_6) to separately dispose the transistors in different rows, the testing circuit of the present embodiment can effectively save the circuit placement space in the first direction P1.

However, the configuration order of the control line SB and the testing signal lines V1 to V6 of the disclosure is not limited to FIG. 1. In an embodiment, the transistors 110_2, 110_4, and 110_6 in the even group are closer to the pixel array than the transistors 110_1, 110_3, and 110_5 in the odd group. However, the configuration order of the control line SB and the testing signal lines V1 to V6 may be sequentially arranged along a direction opposite to the second direction P2.

Figure 2:
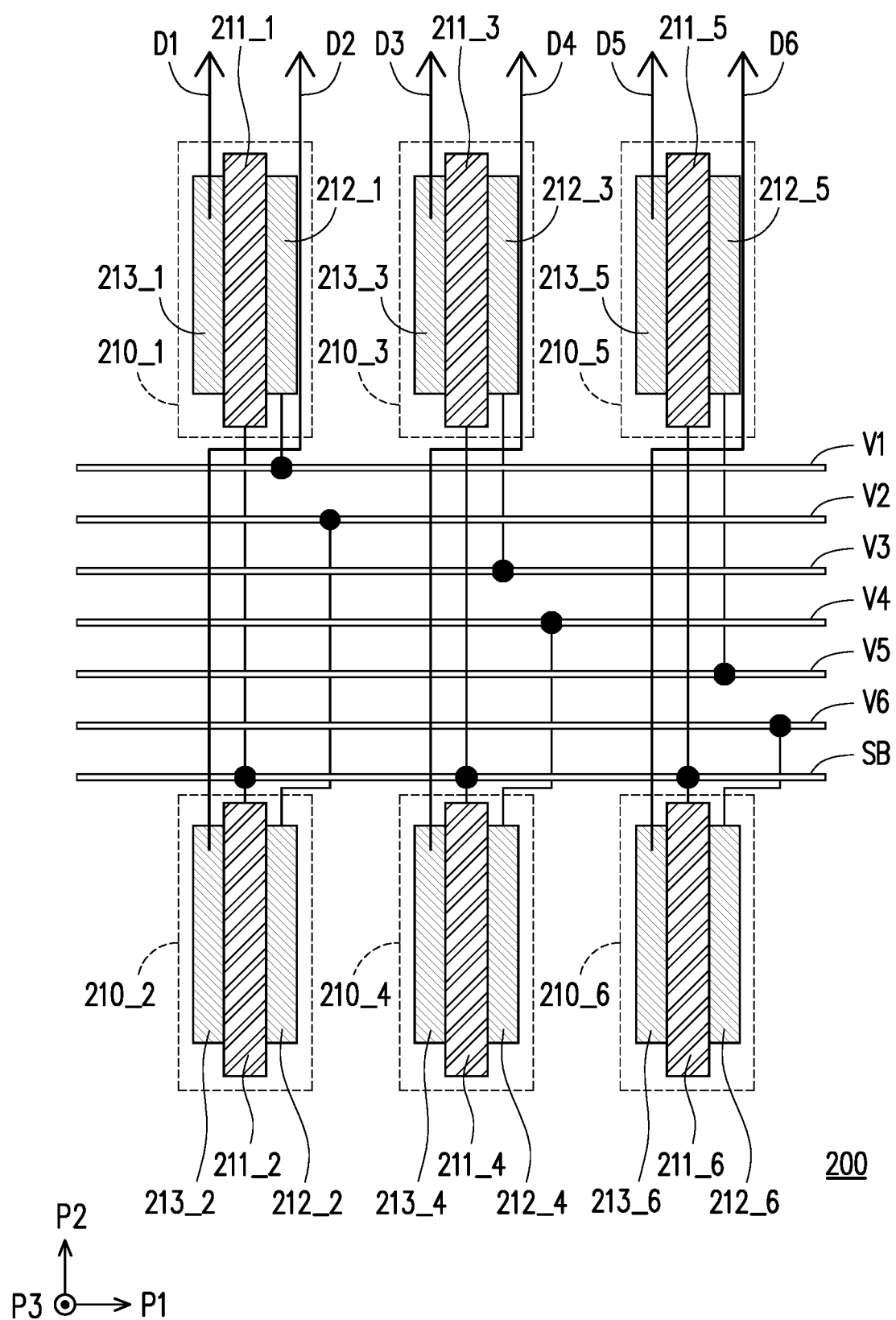
FIG. 2 is a schematic view of a testing circuit according to the second embodiment of the disclosure.

FIG. 2 is a schematic view of a testing circuit according to the second embodiment of the disclosure. Referring to FIG. 2, a circuit 200 includes a testing circuit and a plurality of signal lines D1 to D6. The testing circuit of the present embodiment includes a plurality of transistors 210_1 to 210_6, a plurality of testing signal lines V1 to V6, and a control line SB. The plurality of transistors 210_1 to 210_6 are electrically connected to the signal lines D1 to D6. In the present embodiment, the transistors 210_1 to 210_6 are disposed in two groups, which may be divided into an odd group (the transistors 210_1, 210_3, and 210_5) and an even group (the transistors 210_2, 210_4, and 210_6). The two groups of transistors are respectively arranged in a first direction P1 (horizontal direction), and the two groups of transistors are disposed in two rows in a second direction P2 (vertical direction). The two groups of transistors are separately disposed on both sides of a wire region of the testing signal lines V1 to V6 and the control line SB.

In the present embodiment, the transistors 210_1 to 210_6 respectively include gates 211_1 to 211_6, drains 212_1 to 212_6, and sources 213_1 to 213_6. The gates 211_1 to 211_6 of the transistors 210_1 to 210_6 are electrically connected to the control line SB to receive a control signal. The drains 212_1 to 212_6 of the transistors 210_1 to 210_6 are respectively electrically connected to the testing signal lines V1 to V6 to respectively receive testing signals. The sources 213_1 to 213_6 of the transistors 210_1 to 210_6 are respectively electrically connected to the signal lines D1 to D6 to respectively provide driving signals to the corresponding columns of pixel units in the corresponding pixel array through the signal lines D1 to D6, so as to, for example, perform a LOT. Moreover, the electrical connection relationship of the transistors 210_1 to 210_6 with the testing signal lines V1 to V6, the control line SB, and the signal lines D1 to D6 is the same as the electrical connection relationship of the transistors 110_1 to 110_6 of FIG. 1.

Different from FIG. 1, in the present embodiment, the control line SB and the testing signal lines V1 to V6 are sequentially arranged along the direction opposite to the second direction P2. The transistors 210_1, 210_3, and 210_5 in the odd group are configured on a side adjacent to the testing signal line V1. The transistors 210_2, 210_4, and 210_6 in the even group are configured on a side adjacent to the control line SB, and are farther away from the pixel array than the transistors 210_1, 210_3, and 210_5 in the odd group. Therefore, since the testing circuit of the present embodiment divides the transistors 210_1 to 210_6 into the odd group (the transistors 210_1, 210_3, and 210_5) and the even group (the transistors 210_2, 210_4, and 210_6) to separately dispose the transistors in different rows, the testing circuit of the present embodiment can effectively save the circuit placement space in the first direction P1.

However, the configuration order of the control line SB and the testing signal lines V1 to V6 of the disclosure is not limited to FIG. 2. In an embodiment, the transistors 210_2, 210_4, and 210_6 in the even group are also farther away from the pixel array than the transistors 210_1, 210_3, and 210_5 in the odd group. However, the configuration order of the testing signal lines V1 to V6 and the control line SB may be sequentially arranged along the second direction P2.

In addition, in a testing embodiment, when a circuit analysis is performed on a certain testing circuit, if testing signal lines of the testing circuit are located in the middle or between two rows of transistors of the testing circuit, and signal lines electrically connected to the upper and lower rows of transistors are respectively jump cut at intervals, for example, every two adjacent transistors are respectively electrically connected to two discontinuously arranged signal lines, the testing circuit may be regarded as implementing the structural design of the testing circuit of FIG. 1 or FIG. 2 of the disclosure.

Figure 3:
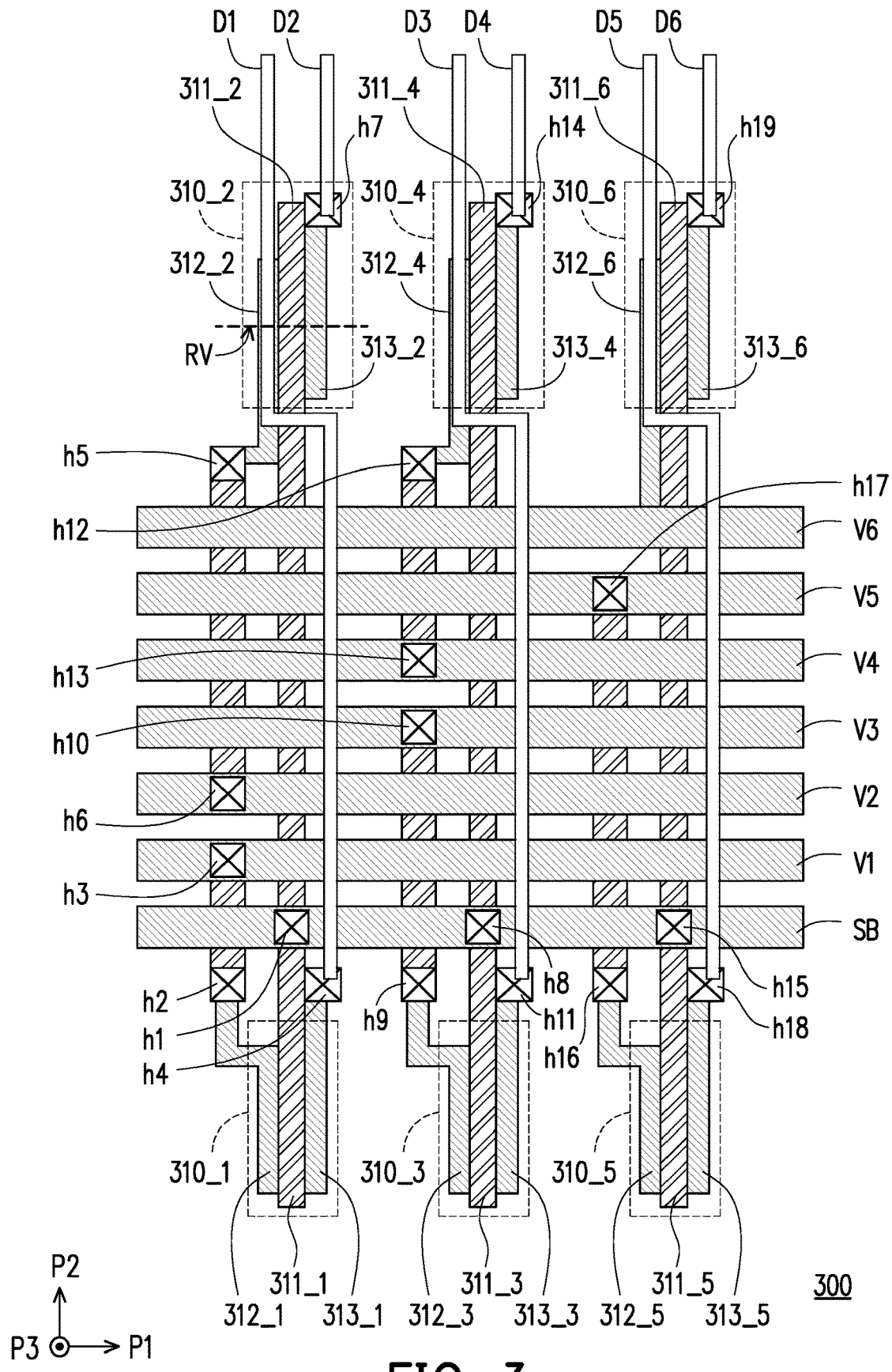
FIG. 3 is a schematic view of a process layout of a circuit according to the first embodiment of the disclosure.

FIG. 3 is a schematic view of a process layout of a circuit according to the first embodiment of the disclosure. The process layout of the circuit 100 of FIG. 1 may be as shown in FIG. 3. Referring to FIG. 3, in the present embodiment, a circuit 300 includes a testing circuit and a plurality of signal lines D1 to D6. The testing circuit of the present embodiment includes a plurality of transistors 310_1 to 310_6 electrically connected to the signal lines D1 to D6, and includes a plurality of testing signal lines V1 to V6 and a control line SB. In the present embodiment, gates 311_1 to 311_6 of the transistors 310_1 to 310_6 and drains 312_1 to 312_6 and sources 313_1 to 313_6 of the transistors 310_1 to 310_6 are formed on metal layers of different heights, and the drains 312_1 to 312_6 and the sources 313_1 to 313_6 of the transistors 310_1 to 310_6 are formed on metal layers of the same height. In the present embodiment, the control line SB and the testing signal lines V1 to V6 are sequentially arranged along the second direction P2. The transistors 310_1, 310_3, and 310_5 in the odd group are configured on a side adjacent to the control line. The transistors 310_2, 310_4, and 310_6 in the even group are configured on a side adjacent to the testing signal line V6, and are closer to the pixel array than the transistors 310_1, 310_3, and 310_5 in the odd group.

In the present embodiment, graphics with the same pattern in FIG. 3 may be regarded as being located on a same metal layer of a display panel 30. Specifically, in the present embodiment, the gates 311_1 to 311_6 of the transistors 310_1 to 310_6 are extended below a metal wire of the control line SB through wires of a same metal layer, and are electrically connected to the control line SB through vias h1, h8, and h15. In the present embodiment, the drains 312_1 to 312_5 of the transistors 310_1 to 310_5 are extended to respective corresponding vias h2, h5, h9, h12, and h16 through wires of a same metal layer, then extended below metal wires of the respective corresponding testing signal lines V1 to V5 through wires electrically connected to the vias h2, h5, h9, h12, and h16 and located on a metal layer below the testing signal lines V1 to V6 and the control line SB, and finally electrically connected to the respective corresponding testing signal lines V1 to V5 through respective corresponding vias h3, h6, h10, h13, and h17. In addition, since the drain 312_6 of the transistor 310_6 is not required to cross other signal lines, the drain 312_6 of the transistor 310_6 may be directly extended and electrically connected to the testing signal line V6 through the wires of the same metal layer. In the present embodiment, the sources 313_1 to 313_6 of the transistors 310_1 to 310_6 are extended to respective corresponding vias h4, h7, h11, h14, h18, and h19 through wires of a same metal layer, and then electrically connected to the respective corresponding signal lines D1 to D6 through the vias h4, h7, h11, h14, h18, and h19. In addition, the signal lines D1 to D6 are extended, toward the second direction P2, to corresponding columns of pixel units in the pixel array of the display panel 30 through wires of a metal layer located above the testing signal lines V1 to V6 and the control line SB. Therefore, the process layout of the testing circuit of the present embodiment can effectively save the circuit placement space of the testing circuit in the first direction P1.

In addition, it is worth noting that since the wire distances extended from the gates 311_1 to 311_6 and the drains 312_1 to 312_5 of the transistors 310_1 to 310_5 of the transistors 310_1 to 310_5 to the respective vias are relatively close, to avoid short circuit between the wires extended from the gates 311_1 to 311_6 and the drains 312_1 to 312_5 of the transistors 310_1 to 310_5 to the respective vias, all the wires extended from the drains 312_1 to 312_5 of the transistors 310_1 to 310_5 to the respective corresponding vias h3, h6, h10, h13, and h17 are extended for a distance toward a direction (opposite to the first direction P1) away from the gates 311_1 to 311_6, and then extended to the respective corresponding vias h3, h6, h10, h13, and h17.

Figure 4:
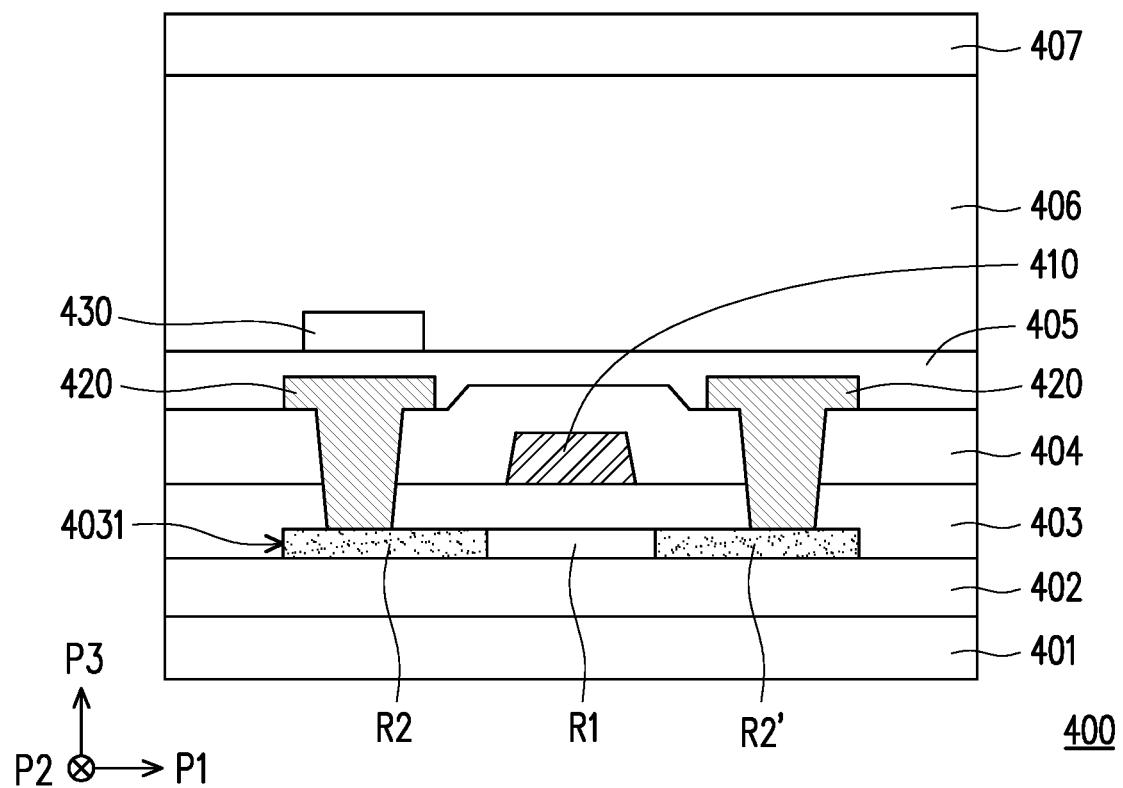
FIG. 4 is a cross-sectional structure view of a transistor according to an embodiment of the disclosure.

FIG. 4 is a cross-sectional structure view of a transistor according to an embodiment of the disclosure. The cross-sectional structure of the present embodiment may be, for example, a cross-sectional structure of a plane (viewed toward the second direction P2) formed by the transistor 310_2 of FIG. 3 along the first direction P1 and the third direction P3 of a reference line RV, but the disclosure is not limited thereto. All of the transistors 310_1 to 310_6 have the cross-sectional structure of a transistor 400 of the present embodiment. Taking the cross-section of the transistor 310_2 as an example, referring to FIG. 4, the transistor 400 is formed on a substrate in the peripheral region of the display panel. On the display panel, a substrate 401, a buffer layer 402, an active layer 4031, a gate insulating layer 403, a metal interlayer dielectric layer 404, an insulating layer 405, a planarization layer 406, and an insulating layer 407 are sequentially formed in the third direction P3. In the present embodiment, a lightly doped region R1 and heavily doped regions R2 and R2' are formed and included in the active layer 4301, and the lightly doped region R1 is located between the heavily doped regions R2 and R2'. In the present embodiment, a metal layer 410 of the gate of the transistor 400 is formed on the gate insulating layer 403. A metal layer 420 of the drain and the source of the transistor 400 is formed on the metal interlayer dielectric layer 404 and is electrically connected to the heavily doped regions R2 and R2' by penetrating the gate insulating layer 403 and the metal interlayer dielectric layer 404. In addition, a metal layer 430 passing through the signal line above the drain of the transistor 400 may be formed on the insulating layer 405. That is, the metal layer 430 passing through the signal line above the drain of the transistor 400, the metal layer 410 of the gate of the transistor 400, and the metal layer 420 of the drain and the source of the transistor 400 are respectively formed on metal layers of different heights.

Figure 5:
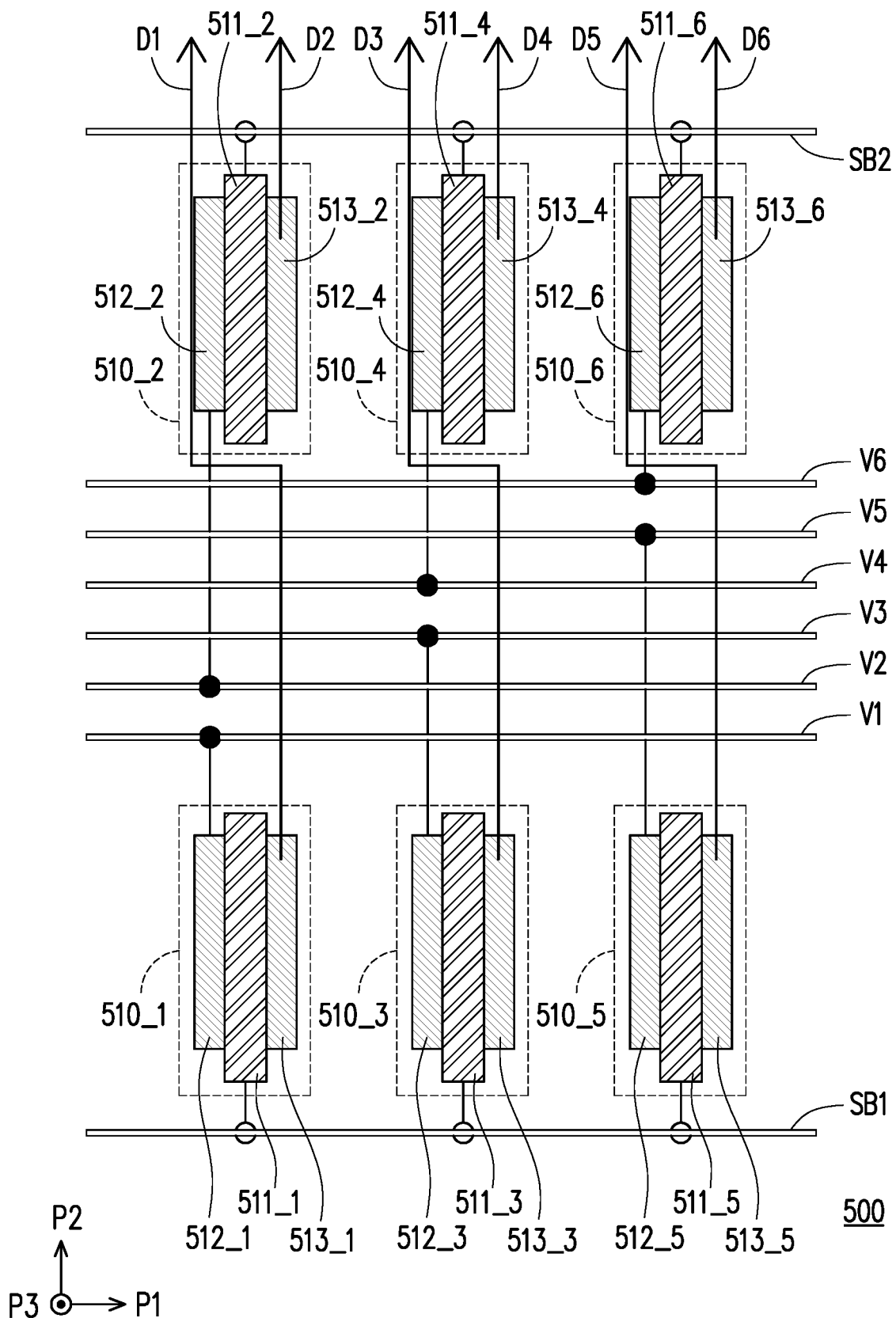
FIG. 5 is a schematic view of a testing circuit according to the third embodiment of the disclosure.

FIG. 5 is a schematic view of a testing circuit according to the third embodiment of the disclosure. Referring to FIG. 5, a circuit 500 includes a testing circuit and a plurality of signal lines D1 to D6. The testing circuit of the present embodiment includes a plurality of transistors 510_1 to 510_6 electrically connected to the signal lines D1 to D6, and includes a plurality of testing signal lines V1 to V6 and control lines SB1 and SB2. In the present embodiment, the transistors 510_1 to 510_6 are disposed in two groups, which may be divided into an odd group (the transistors 510_1, 510_3, and 510_5) and an even group (the transistors 510_2, 510_4, and 510_6). The two groups of transistors are respectively arranged in a first direction P1 (horizontal direction), and the two groups of transistors are disposed in two rows in a second direction P2 (vertical direction). The two groups of transistors are separately disposed on both sides of a wire region of the testing signal lines V1 to V6. In addition, the control lines SB1 and SB2 are located outside the two rows of the transistors 510_1 to 510_6.

In the present embodiment, the transistors 510_1 to 510_6 respectively include gates 511_1 to 511_6, drains 512_1 to 512_6, and sources 513_1 to 513_6. The gates 511_1, 511_3, and 511_5 of the transistors 510_1, 510_3, and 510_5 in the odd group are electrically connected to the control line SB1 to receive a control signal. The gates 511_2, 511_4, and 511_6 of the transistors 510_2, 510_4, and 510_6 in the even group are electrically connected to the control line SB2 to receive another control signal. The drains 512_1 to 512_6 of the transistors 510_1 to 510_6 are respectively electrically connected to the testing signal lines V1 to V6 to respectively receive testing signals. The sources 513_1 to 513_6 of the transistors 510_1 to 510_6 are respectively electrically connected to the signal lines D1 to D6 to respectively provide driving signals to corresponding columns of pixel units in the corresponding pixel array through the signal lines D1 to D6, so as to, for example, perform a LOT.

More specifically, in the present embodiment, the control line SB1, the testing signal lines V1 to V6, and the control line SB2 are sequentially arranged along the second direction P2. The transistors 510_1, 510_3, and 510_5 in the odd group are configured between the testing signal line V1 and the control line SB1. The transistors 510_2, 510_4, and 510_6 in the even group are configured between the testing signal line V6 and the control line SB2, and are closer to the pixel array than the transistors 510_1, 510_3, and 510_5 in the odd group. The drains 512_1, 512_3, and 512_5 of the transistors 510_1, 510_3, and 510_5 in the odd group are sequentially electrically connected to the odd-numbered testing signal lines V1, V3, and V5, and the sources 513_1, 513_3, and 513_5 are sequentially electrically connected to the odd-numbered signal lines D1, D3, and D5. The drains 512_2, 512_4, and 512_6 of the transistors 510_2, 510_4, and 510_6 in the even group are sequentially electrically connected to the even-numbered testing signal lines V2, V4, and V6, and the sources 513_2, 513_4, and 513_6 are sequentially electrically connected to the even-numbered signal lines D2, D4, and D6. Therefore, since the testing circuit of the present embodiment divides the transistors 510_1 to 510_6 into the odd group (the transistors 510_1, 510_3, and 510_5) and the even group (the transistors 510_2, 510_4, and 510_6) to separately dispose the transistors in different rows, the testing circuit of the present embodiment can effectively save the circuit placement space in the first direction P1.

However, the configuration order of the testing signal lines V1 to V6 of the disclosure is not limited to FIG. 5. In an embodiment, the transistors 510_2, 510_4, and 510_6 in the even group are also closer to the pixel array than the transistors 510_1, 510_3, and 510_5 in the odd group. However, the configuration order of the testing signal lines V1 to V6 may be sequentially arranged along a direction opposite to the second direction P2.

Figure 6:
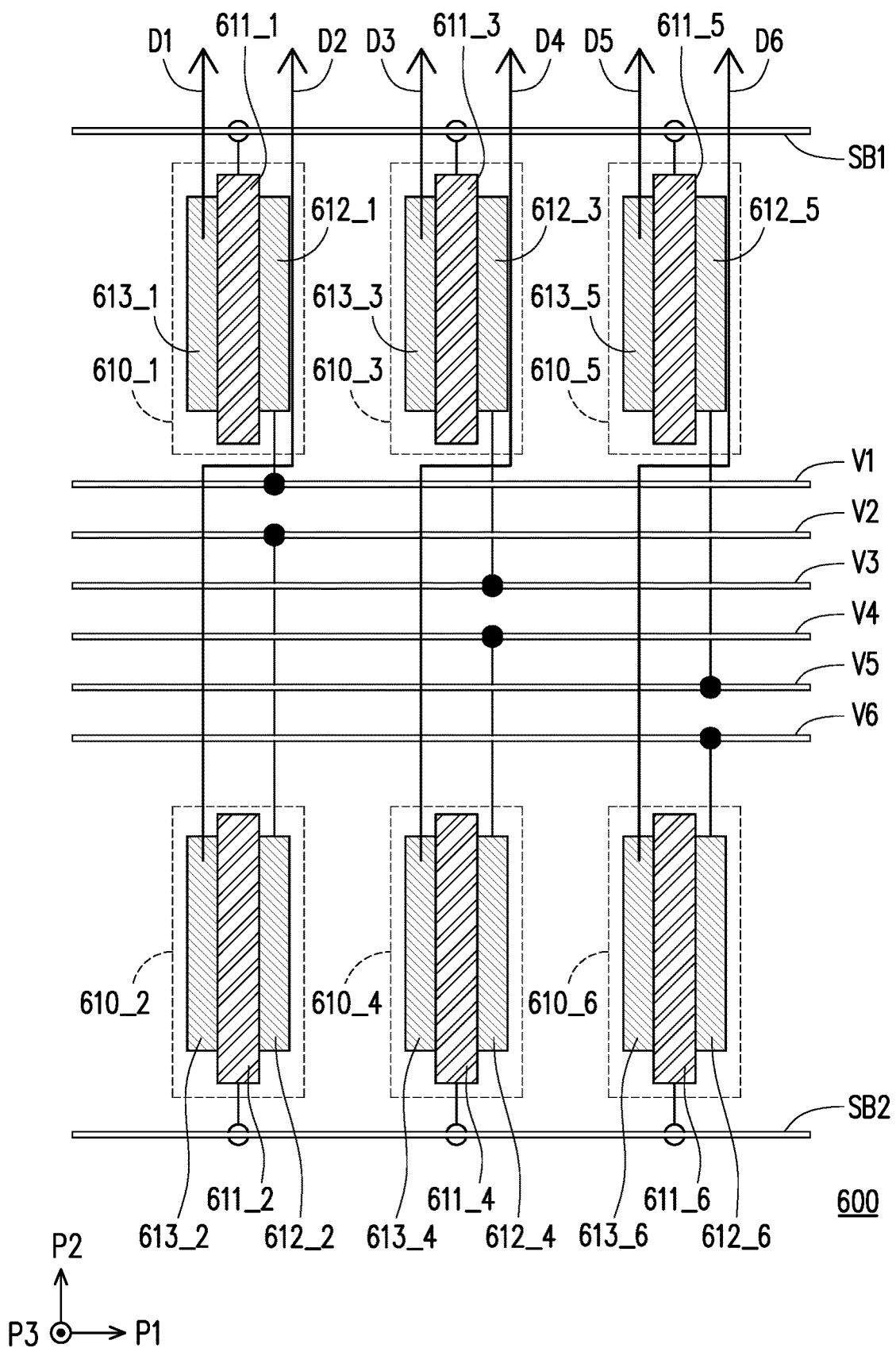
FIG. 6 is a schematic view of a testing circuit according to the fourth embodiment of the disclosure.

FIG. 6 is a schematic view of a testing circuit according to the fourth embodiment of the disclosure. Referring to FIG. 6, a circuit 600 includes a testing circuit and a plurality of signal lines D1 to D6. The testing circuit of the present embodiment includes a plurality of transistors 610_1 to 610_6 electrically connected to the signal lines D1 to D6, and includes a plurality of testing signal lines V1 to V6 and control lines SB1 and SB2. In the present embodiment, the transistors 610_1 to 610_6 are disposed in two groups, which may be divided into an odd group (the transistors 610_1, 610_3, and 610_5) and an even group (the transistors 610_2, 610_4, and 610_6). The two groups of transistors are respectively arranged in a first direction P1 (horizontal direction), and the two groups of transistors are disposed in two rows in a second direction P2 (vertical direction). The two groups of transistors are separately disposed on both sides of a wire region of the testing signal lines V1 to V6. In addition, the control lines SB1 and SB2 are located outside the two rows of the transistors 610_1 to 610_6.

In the present embodiment, the transistors 610_1 to 610_6 respectively include gates 611_1 to 611_6, drains 612_1 to 612_6, and sources 613_1 to 613_6. The gates 611_1, 611_3, and 611_5 of the transistors 610_1, 610_3, and 610_5 in the odd group are electrically connected to the control line SB1 to receive a control signal. The gates 611_2, 611_4, and 611_6 of the transistors 610_2, 610_4, and 610_6 in the even group are electrically connected to the control line SB2 to receive another control signal. The drains 612_1 to 612_6 of the transistors 610_1 to 610_6 are respectively electrically connected to the testing signal lines V1 to V6 to respectively receive testing signals. The sources 613_1 to 613_6 of the transistors 610_1 to 610_6 are respectively electrically connected to the signal lines D1 to D6 to respectively provide driving signals to corresponding columns of pixel units in the corresponding pixel array through the signal lines D1 to D6, so as to, for example, perform a LOT.

Different from FIG. 5, in the present embodiment, the wire position of the control lines SB1 and SB2 is opposite to FIG. 5, and the testing signal lines V1 to V6 are sequentially arranged along a direction opposite to the second direction P2. The transistors 610_2, 610_4, and 610_6 in the even group are farther away from the pixel array than the transistors 610_1, 610_3, and 610_5 in the odd group. Therefore, since the testing circuit of the present embodiment divides the transistors 610_1 to 610_6 into the odd group (the transistors 610_1, 610_3, and 610_5) and the even group (the transistors 610_2, 610_4, and 610_6) to separately dispose the transistors in different rows, the testing circuit 600 of the present embodiment can effectively save the circuit placement space in the first direction P1.

However, the configuration order of the testing signal lines V1 to V6 of the disclosure is not limited to FIG. 6. In an embodiment, the transistors 610_2, 610_4, and 610_6 in the even group are also farther away from the pixel array than the transistors 610_1, 610_3, and 610_5 in the odd group. However, the configuration order of the testing signal lines V1 to V6 may be sequentially arranged along the second direction P2.

In addition, in a testing embodiment, when a circuit analysis is performed on a certain testing circuit, if testing signal lines of the testing circuit are located in the middle or between two rows of transistors of the testing circuit, and signal lines electrically connected to the upper and lower rows of transistors are respectively jump cut at intervals, for example, every two adjacent transistors are respectively electrically connected to two discontinuously arranged signal lines, the testing circuit may be regarded as implementing the structural design of the testing circuit of FIG. 5 or FIG. 6 of the disclosure. Alternatively, in another testing embodiment, when a circuit analysis is performed on a certain testing circuit, if the testing circuit may have two control lines located outside the two rows of transistors, the testing circuit may also be regarded as implementing the structural design of the testing circuit 500 or 600 of FIG. 5 or FIG. 6 of the disclosure.

Figure 7:
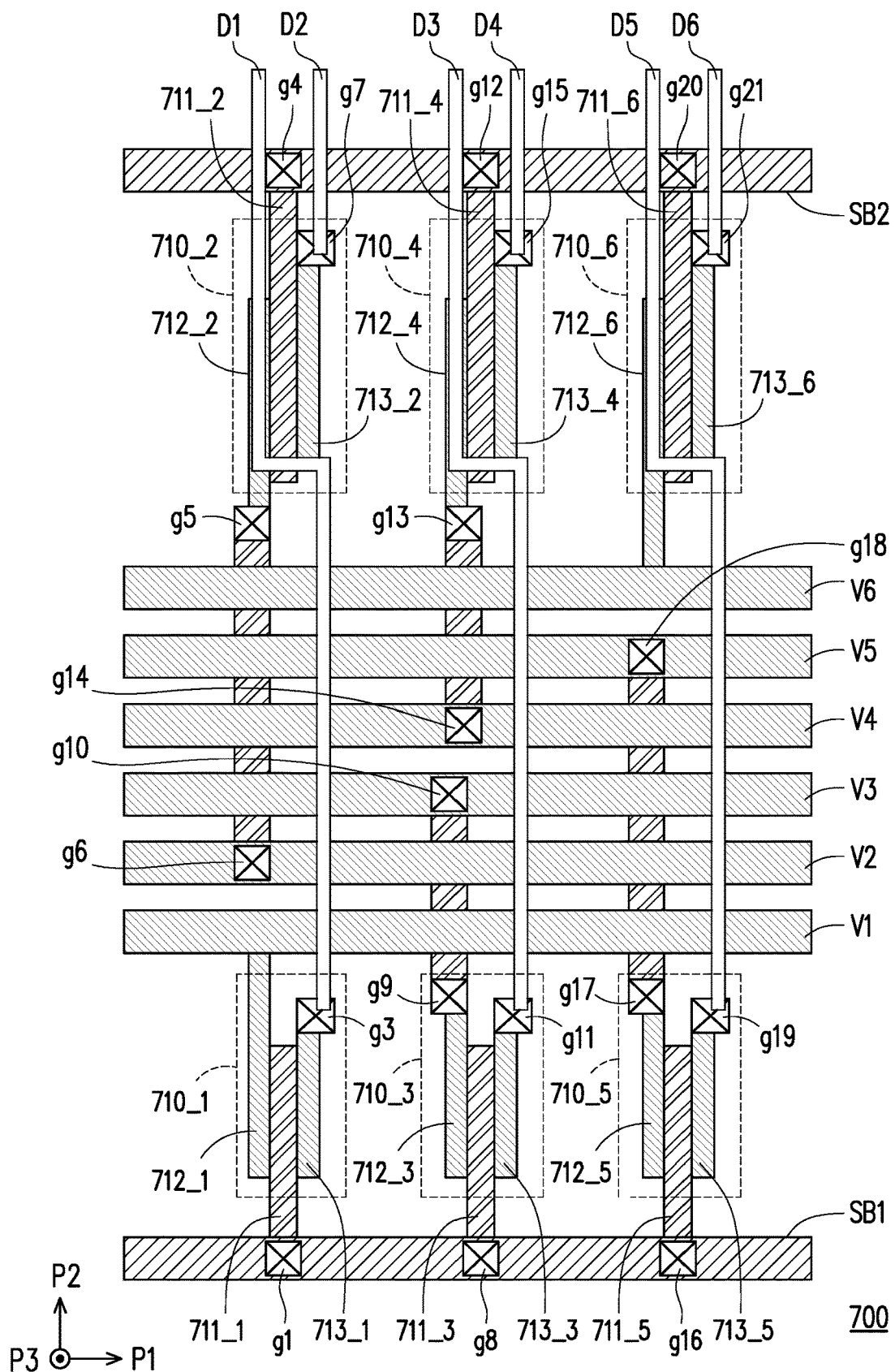
FIG. 7 is a schematic view of a process layout of a circuit according to the third embodiment of the disclosure.

FIG. 7 is a schematic view of a process layout of a circuit according to the third embodiment of the disclosure. The process layout of the circuit 500 of FIG. 5 may be as shown in FIG. 7. Referring to FIG. 7, in the present embodiment, a circuit 700 includes a testing circuit and a plurality of signal lines D1 to D6. The testing circuit of the present embodiment includes a plurality of transistors 710_1 to 710_6 electrically connected to the signal lines D1 to D6, and includes a plurality of testing signal lines V1 to V6 and control lines SB1 and SB2. In the present embodiment, gates 711_1 to 711_6 of the transistors 710_1 to 710_6 and drains 712_1 to 712_6 and sources 713_1 to 713_6 of the transistors 710_1 to 710_6 are formed on metal layers of different heights, and the drains 712_1 to 712_6 and the sources 713_1 to 713_6 of the transistors 710_1 to 710_6 are formed on metal layers of the same height. In the present embodiment, the testing signal lines V1 to V6 are sequentially arranged along the second direction P2. The transistors 710_1, 710_3, and 710_5 in the odd group are configured on a side adjacent to the testing signal line V1. The transistors 710_2, 710_4, and 710_6 in the even group are configured on a side adjacent to the testing signal line V6, and are closer to the pixel array than the transistors 710_1, 710_3, and 710_5 in the odd group. The control line SB1 is located on a side of the transistors 710_1, 710_3, and 710_5 in the odd group away from the testing signal line V1, and the control line SB2 is located on a side of the transistors 710_2, 710_4, and 710_6 in the even group away from the testing signal line V6.

In the present embodiment, the graphics with the same pattern in FIG. 7 may be regarded as being located on a same metal layer of a display panel 70. Specifically, in the present embodiment, the gates 711_1 to 711_6 of the transistors 710_1 to 710_6 are extended below metal wires of the respective corresponding control lines SB1 and SB2 through wires of a same metal layer, and are electrically connected to the respective corresponding control lines SB1 and SB2 through vias g1, g4, g8, g12, g16, and g20. In the present embodiment, the drains 712_2 to 712_5 of the transistors 710_1 to 710_5 are extended to respective corresponding vias g5, g9, g13, and g17 through wires of a same metal layer, then extended below metal wires of the respective corresponding testing signal lines V2 to V5 through wires electrically connected to the vias g5, g9, g13, and g17 and located on a metal layer below the testing signal lines V1 to V6 and the control lines SB1 and SB2, and finally electrically connected to the respective corresponding testing signal lines V2 to V5 through respective corresponding vias g6, g10, g14, and g18. In addition, since the drains 712_1 and 712_6 of the transistors 710_1 and 710_6 are not required to cross other signal lines, the drains 712_1 and 712_6 of the transistors 710_1 and 710_6 may be directly extended and electrically connected to the testing signal lines V1 and V6 respectively through the wires of the same metal layer. In the present embodiment, the sources 713_1 to 713_6 of the transistors 710_1 to 710_6 are extended to respective corresponding vias g3, g7, g11, g15, g19, and g21 through wires of a same metal layer, and then electrically connected to the respective corresponding signal lines D1 to D6 through the vias g3, g7, g11, g15, g19, and g21. In addition, the signal lines D1 to D6 are extended, toward the second direction P2, to corresponding columns of pixel units in the pixel array of the display panel 70 through wires of a metal layer located above the testing signal lines V1 to V6 and the control lines SB1 and SB2. Therefore, the process layout of the testing circuit of the present embodiment can effectively save the circuit placement space of the testing circuit in the first direction P1, and effectively avoid short circuit between the wires of the gates 711_1 to 711_6 and the drains 712_1 to 712_6 of the transistors 710_1 to 710_6.

In summary of the above, the testing circuit of the display panel of the disclosure may divide the plurality of transistors into two rows to dispose the transistors on both sides of the testing signal lines, so as to effectively reduce the circuit placement space in the horizontal direction and help achieve the effect of a narrow bezel. Moreover, the testing circuit of the display panel of the disclosure may further respectively electrically connect the two rows of transistors to the two control lines, and the two control lines are disposed on the outer side of the two rows of transistors, so as to effectively avoid short circuit between the wires of the gate and the drain of each of the transistors.

Finally, it should be noted that the above embodiments are merely used to illustrate the technical solutions of the disclosure and are not intended to limit them, and the features of the embodiments may be arbitrarily mixed and matched as long as they do not violate the spirit of the disclosure or conflict with each other. Although the disclosure has been described in detail with reference to the above embodiments, persons of ordinary skill in the art should understand that they may still modify the technical solutions described in the above embodiments, or replace some or all of the technical features therein with equivalents, and that such modifications or replacements do not cause the corresponding technical solutions to substantially deviate from the scope of the technical solutions of the embodiments of the disclosure.

What is claimed is:
1. A display panel, comprising:
   a plurality of signal lines; and
   a testing circuit, comprising a plurality of transistors and a plurality of testing signal lines extending in a first direction, wherein the plurality of transistors are electrically connected to the plurality of signal lines and the plurality of testing signal lines,
   wherein the plurality of transistors are disposed in at least two groups in a second direction, and a number of transistors of each group of the at least two groups is less than a total number of the plurality of signal lines,
wherein at least a part of the plurality of testing signal lines are located between two adjacent groups of the at least two groups, and
wherein a plurality of sources of the plurality of transistors are extended to a plurality of vias through a plurality of wires of a same metal layer, and then electrically connected to the plurality of signal lines through the plurality of vias.

2. The display panel according to claim 1, wherein the plurality of signal lines are coupled to a plurality of data lines of a pixel array.

3. The display panel according to claim 1, wherein the plurality of signal lines are extended toward the second direction.

4. The display panel according to claim 1, wherein the first direction is perpendicular to the second direction.

5. The display panel according to claim 1, wherein the plurality of transistors are disposed in at least two rows.

6. The display panel according to claim 5, wherein the plurality of transistors are disposed in two rows.

7. The display panel according to claim 6, wherein the plurality of transistors in one of the two rows are sequentially electrically connected to the plurality of odd-numbered signal lines, and the plurality of transistors in another one of the two rows are sequentially electrically connected to the plurality of even-numbered signal lines.

8. The display panel according to claim 6, wherein the two rows of the plurality of transistors are respectively arranged in the first direction.

9. The display panel according to claim 8, wherein the plurality of transistors are disposed in the two rows in the second direction.

10. The display panel according to claim 6, wherein the plurality of transistors in one of the two rows are sequentially electrically connected to the plurality of odd-numbered testing signal lines, and the plurality of transistors in another one of the two rows are sequentially electrically connected to the plurality of even-numbered testing signal lines.

11. The display panel according to claim 10, wherein the plurality of testing signal lines are located between the two rows.

12. The display panel according to claim 10, wherein a part of a plurality of drains of the plurality of transistors are directly extended and electrically connected to a part of the plurality of testing signal lines respectively through a plurality of wires of a same metal layer.

13. The display panel according to claim 6, wherein the plurality of transistors are controlled by a control signal from a control line.

14. The display panel according to claim 13, wherein a plurality of gates of the plurality of transistors are extended below a metal wire of the control line through a plurality of wires of a same metal layer, and are electrically connected to the control line through a plurality of vias.

15. The display panel according to claim 13, wherein the control line is located outside the two rows.

16. The display panel according to claim 13, wherein a number of the control line is two, and the two control lines are respectively located on different sides outside the two rows.

17. The display panel according to claim 13, wherein the control line is located between the two rows.

18. The display panel according to claim 17, wherein the plurality of transistors in an even group are configured on a side adjacent to the control line.

19. The display panel according to claim 17, wherein the plurality of transistors in an odd group are configured on a side adjacent to the control line.

* * * * *